(12) United States Patent
Hsieh

(10) Patent No.: US 8,038,452 B2
(45) Date of Patent: Oct. 18, 2011

(54) TEST SOCKET WITH DISCRETE GUIDING POSTS DEFINING SIDE WALLS

(75) Inventor: Wen-Yi Hsieh, Tu-cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 254 days.

(21) Appl. No.: 12/384,626

(22) Filed: Apr. 7, 2009

(65) Prior Publication Data

US 2009/0253277 A1   Oct. 8, 2009

(30) Foreign Application Priority Data

Apr. 7, 2008   (TW) ................................ 97205834 U

(51) Int. Cl.
*H01R 12/00* (2006.01)

(52) U.S. Cl. ........................................................ 439/68

(58) Field of Classification Search .................... 439/68, 439/71, 72, 73, 266, 330, 331; 324/757.04
See application file for complete search history.

(56) References Cited

U.S. PATENT DOCUMENTS 4,993,955 A * 2/1991 Savant ............................ 439/73
5,490,795 A * 2/1996 Hetzel et al. .................. 439/266

* cited by examiner

*Primary Examiner* — Alexander Gilman
(74) *Attorney, Agent, or Firm* — Wei Te Chung; Andrew C. Cheng; Ming Chieh Chang

(57) ABSTRACT

A test socket, adapted for electrically connecting an IC package to a printed circuit board, comprises a bottom board (10) and four separated clumps (20). The bottom board has a main body (11) having a rectangular shape and four mounting portions (12) integrally extending outwardly from four corners of the main body, respectively. The clumps are assembled upon the four mounting portions of the bottom board to cooperate with the bottom board to define a receiving space for receiving the IC package.

9 Claims, 3 Drawing Sheets

TEST SOCKET WITH DISCRETE GUIDING POSTS DEFINING SIDE WALLS

BACKGROUND OF THE INVENTION

1. Field of the Invention

The present invention relates to a test socket for testing an IC package, and more particularly to a test socket having discrete guideposts defining imaginary sidewalls.

2. Description of the Related Art

Electronic package, such as integrated circuit (IC), is miniaturized electronic devices in which a number of active and passive circuit elements are located on or within a continuous body of material to perform a function of a complete circuit. To ensure reliability of IC package, IC package requires burn-in test, in which IC package is run at high temperature for an extended period of time to accelerate its lifespan so as to identify any earlier failure, so as to eliminate early product failures before the IC package is sold and assembled into the end product. Thus, a burn-in socket is needed to receive an IC package thereon and electrically connect the IC package with a burn-in testing board.

US Patent Application Public NO. 2006/0148298 invented by Nakao discloses a test socket for loading and electrically connecting an IC package to a printed circuit board, such as a test printed circuit board, which includes an insulative housing, a plurality of contacts received in the insulative housing, a first cover pivotally assembled to the insulative housing and a second cover pivotally assembled to the first cover. The insulative housing has a box-shape configure and defines a receiving space in a center thereof for receiving the IC package. However, due to developments of electronic industry and communication industry, people need various and small amount of products, including IC packages to meet the field requirements. As a result, the above-mentioned test socket may not properly adapt to this trend, for the test socket must be changed with another one which having a proper receiving space for another IC package to be tested.

Another test socket modify its base for receiving the IC package into two-piece, including a metal frame and a plastic board on a bottom of the frame which cooperates with the frame to define a receiving cavity for the IC package, to meet this various and small amount design trend. However, when the socket is mounted to the printed circuit board by surface mounting technology (SMT), the board will deforms and warp for the metallic and plastic material have different coefficient of thermal expansion (CTE), especially in case the board has a large size.

Hence, it is required to improve the disadvantages of the above sockets.

SUMMARY OF THE INVENTION

An object of the invention is to provide a test socket, which can prevent a bottom board thereof from warping during testing.

To achieve the above-mentioned object, a test socket for electrically connecting an IC package to a printed circuit board, comprises a bottom board and four separated clump attached to four corners thereof. The bottom board has a main body with a substantially rectangular shape for loading the IC package thereon and four mounting portions integrally extending outwardly from four corners of the main body, respectively. The four separated clumps are assembled upon the four mounting portions of the bottom board, respectively, and the clump cooperates with the bottom board to define a receiving space for receiving the IC package therein.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiments of the present invention.

Figure 1:
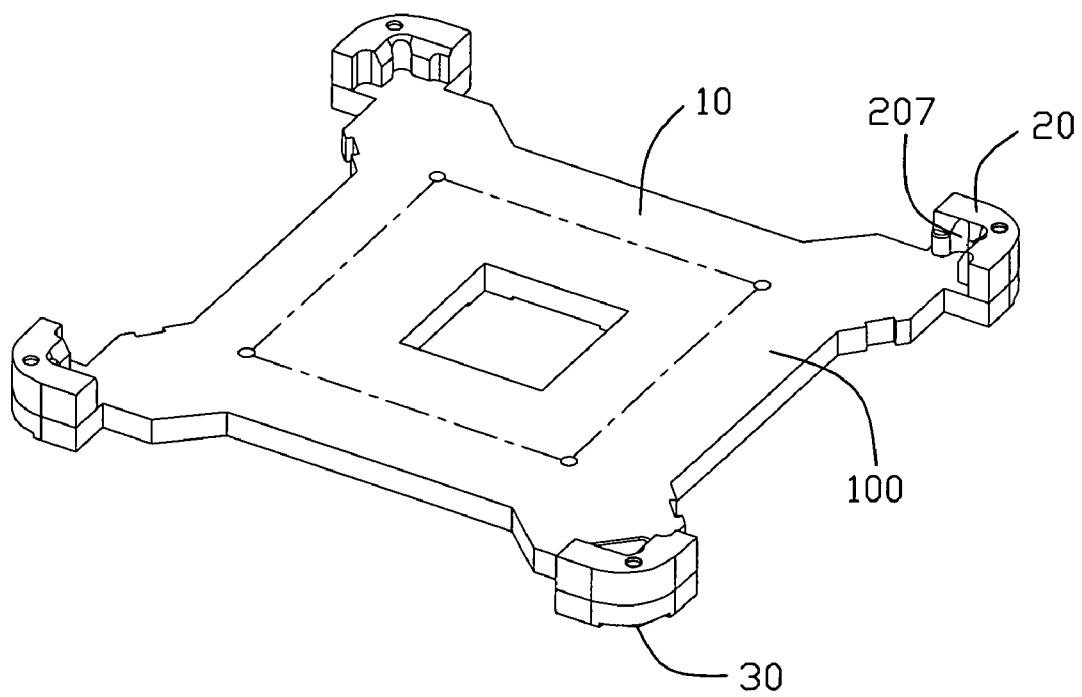
FIG. 1 is an assembled, perspective view of a test socket in accordance with a preferred embodiment of present invention.
Figure 2:
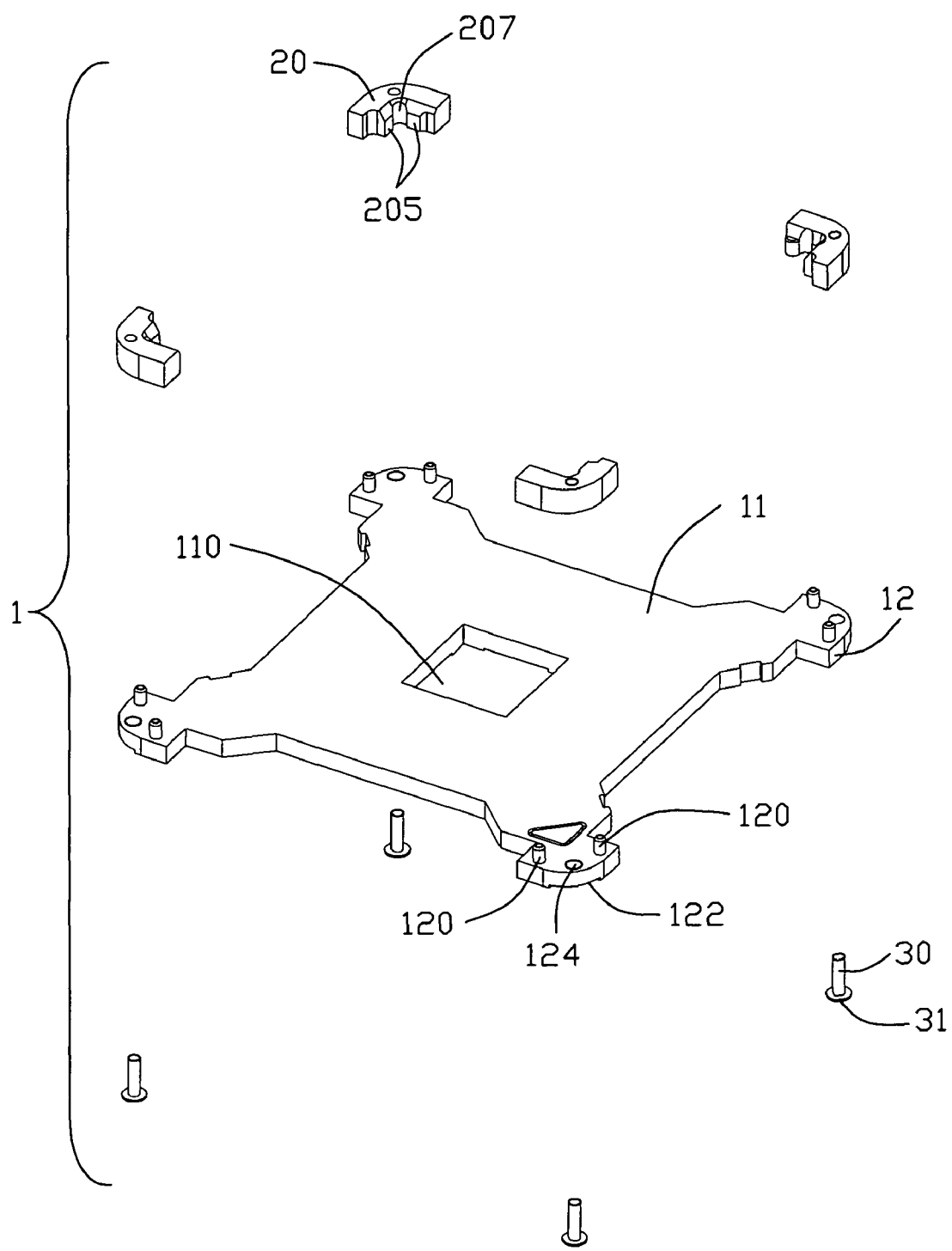
FIG. 2 is an exploded, perspective view of the test socket in accordance with the preferred embodiment of present invention.
Figure 3:
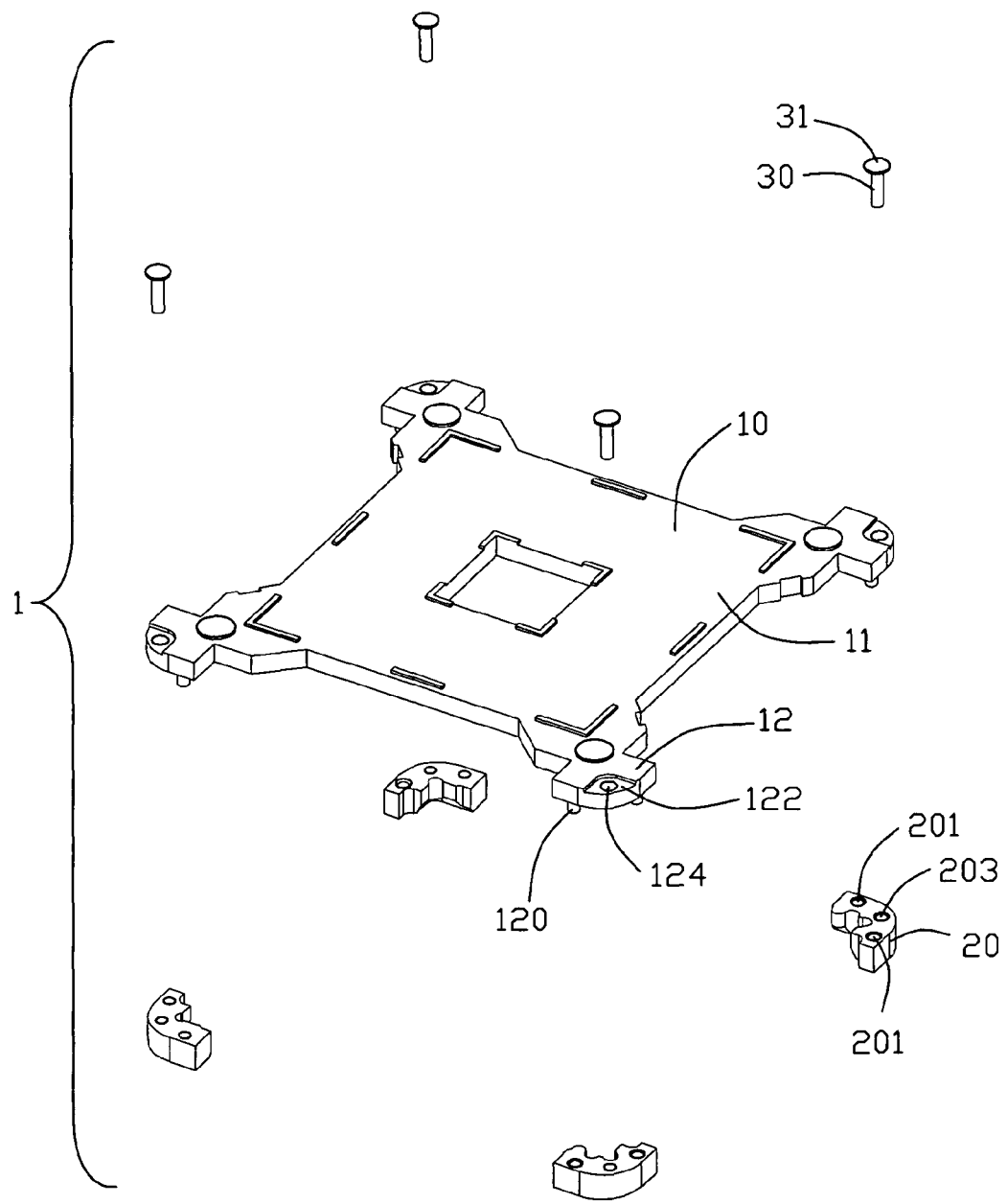
FIG. 3 is a bottom view of the test socket in FIG. 2.

Referring to FIGS. 1-3, a test socket 1 made in accordance with a preferred embodiment of present invention receives a plurality of contacts (not shown) for electrically connecting an IC package to a printed circuit board. The test socket 1 has a bottom board 10, four clumps 20 and screws 30 retaining the clumps 20 to the bottom board 10. The bottom board 10 has a main body 11 with a substantially rectangular shape and four mounting portions 12 extending outwardly along a diagonal direction thereof, respectively. The main body 11 defines an opening 110 in a center thereof, and a center portion of each side of the main body 11 slightly recessed inwardly. The mounting portion 12 has a fan-shaped configure with an arch-style external contour line and is formed with a pair of position posts 120 extending upwardly on a top surface thereof and a concave portion 122 on a bottom surface thereof. A through hole 124 extends through the mounting portion 12 along a top-to-bottom direction, and is located within the concave portion 122.

The clump 20 has a substantially arch-style configuration with its contour line substantially similar to that of the mounting portion 12 of the bottom board 10. The clump 20 defines a pair of positioning holes 201 corresponding to the position posts 120 of the bottom board 10, and an engaging hole 203 corresponding to the through hole 124 of the mounting portion 12 of the bottom board 10 and disposed between the two positioning holes 102. The clump 20 has two ribs 205 protruding inwardly from inner surfaces thereof, respectively, two inner surfaces of the ribs 205 are substantially perpendicular to each other to define a room 207 for accommodating a corner of an IC package (not shown) therein such that the ribs 205 abutting against two sides of the IC package (not shown).

When assembly, the clump 20 is mounted on the mounting portion 12 of the bottom board 10, the position posts 120 of the mounting portions 12 are inserted into the positioning holes 210 of the clumps 20, then the screws 30 pass through the through holes 124 of the bottom board 10 and the engaging holes 203 of the clumps 20 from a bottom side to retain the clump 20 onto the bottom board 10, with a header 31 of the screw 30 received in the concave portion 122 therein. The clumps 20 are located on four corners of the bottom board 10. The separated clumps 20 forms an imaginary sidewalls along two opposite ends of each side of the bottom board 10, so that the clump 20 cooperates with the bottom board 10 to defines a receiving space 100 for the IC package (not shown), synchronously, the ribs 205 abut against four sides of the IC package (not shown), respectively.

The clumps 20 are separately assembled on corners of the bottom board 10, so when the test socket 1 is soldered to a printed circuit board by SMT, the bottom board 10 can expand freely without limitation by the clumps 20, as a result the bottom board 10 will not warp. In this embodiment, the material of the bottom board 10 and that of the clumps 20 are different from each other, wherein bottom board is made from plastic material, while the clump is made of metal. Understandably, it is preferred to have the metallic clumps 20 from some viewpoint.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A test socket for electrically connecting an IC package to a printed circuit board, comprising:
    a bottom board having a main body with a substantially rectangular shape for loading the IC package thereon and four mounting portions integrally extending outwardly from four corners of the main body, respectively; and
    four separated clumps assembled onto the four mounting portions of the bottom board, respectively, the clump cooperating with the bottom board to define a receiving space for receiving the IC package, wherein
    the mounting portion of the bottom board defines a through hole, the clump correspondingly has an engaging hole, a screw passes through the through hole and the engaging hole to retain the clump on the bottom board.

2. The test socket as described in claim 1, wherein the clump defines at least one positioning hole, and the bottom board has at least one positioning post inserted into the positioning hole of the clump.

3. The test socket as described in claim 1, wherein the clump has two ribs protruding inwardly from inner surfaces thereof, two inner surfaces of the two ribs are substantially perpendicular to each other to abut against the IC package.

4. The test socket as described in claim 1, wherein the board is insulative while the clump is metallic.

5. A test socket for electrically connecting an IC package to a printed circuit board, comprising:
    a bottom board having a main body with a substantially rectangular shape for loading the package and a plurality of mounting portions integrally extending outwardly from four edges of the main body, respectively; and
    a plurality of separated clumps assembled upon the mounting portions of the bottom board, respectively, creating an imaginary sidewalls surrounding the main body of the bottom board, so that a receiving space for receiving the IC package is defined by the clumps together with the bottom board, wherein
    the mounting portion of the bottom board defines a through hole, the clump correspondingly has an engaging hole, a screw passes through the through hole and the engaging hole to retain the clump on the bottom board.

6. The test socket as described in claim 5, wherein the clump defines at least one positioning hole, and the bottom board has at least one positioning post inserted into the positioning hole of the clump.

7. The test socket as described in claim 6, wherein the clumps are disposed on four corners of the bottom board, each clump has two ribs protruding inwardly from inner surfaces thereof.

8. The test socket as described in claim 5, wherein the board is insulative while the clump is metallic.

9. A socket for use with an IC package, comprising:
    an plastic bottom board defining a center main body with a plurality of mounting portions at different corners; and
    a metallic clumps individually attached to the mounting portions, respectively, each of said clumps defining an inward confining configuration so as to cooperate with one another to form a complete space for receiving the IC package; wherein
    each of the mounting portions is connected to the main body only via a radial direction so as to allow heat expansion of the main body freely.

* * * * *